(12) United States Patent
Burke

(10) Patent No.: US 6,776,859 B1
(45) Date of Patent: Aug. 17, 2004

(54) ANISOTROPIC BONDING SYSTEM AND METHOD USING DYNAMIC FEEDBACK

(75) Inventor: John Burke, Corona, CA (US)

(73) Assignee: Saturn Electronics & Engineering, Inc., Auburn Hills, MI (US)

( * ) Notice: Subject to any disclaimer, the term of this patent is extended or adjusted under 35 U.S.C. 154(b) by 0 days.

(21) Appl. No.: 09/723,104

(22) Filed: Nov. 27, 2000

(51) Int. Cl.[7] .............................................. B32B 31/20
(52) U.S. Cl. ..................... 156/64; 156/295; 156/299; 156/358; 156/360; 156/583.1
(58) Field of Search ........................ 156/64, 351, 358, 156/359, 360, 378, 295, 290, 291, 297, 299, 583.1

(56) References Cited

U.S. PATENT DOCUMENTS

| | | | |
|---|---|---|---|
| 4,705,587 A | * 11/1987 | Smith | ......................... 156/321 |
| 5,120,665 A | 6/1992 | Tsukagoshi et al. | |
| 5,624,268 A | 4/1997 | Maeda et al. | |
| 5,810,607 A | 9/1998 | Shih et al. | |
| 5,903,056 A | 5/1999 | Canning et al. | |
| 5,975,922 A | 11/1999 | Jin | |
| 6,077,382 A | * 6/2000 | Watanabe | .................... 156/299 |
| 6,323,661 B1 | * 11/2001 | Wildes et al. | ................ 324/715 |
| 6,336,990 B1 | * 1/2002 | Tanaka et al. | ........... 156/306.9 |

* cited by examiner

Primary Examiner—Richard Crispino
Assistant Examiner—George R. Koch, III
(74) Attorney, Agent, or Firm—Rader, Fishman & Grauer PLLC

(57) ABSTRACT

An improved anisotropic bonding system and method connects two conductive surfaces together using an anisotropic material having elastic conductive particles dispersed in an insulating, heat-curable carrier. The system monitors bond resistance in real-time during the bonding process and controls the application of pressure to the bond based on a feedback signal corresponding to the bond resistance. When the bond resistance reaches a predetermined value, the applied pressure is reduced to a holding/clamping level to prevent over-compression as the curing schedule completes curing of the insulating carrier. By monitoring and responding to the bond resistance in real time during the bond compression process, the system prevents bond resistance increases caused by over-compression and conductor damage.

15 Claims, 3 Drawing Sheets

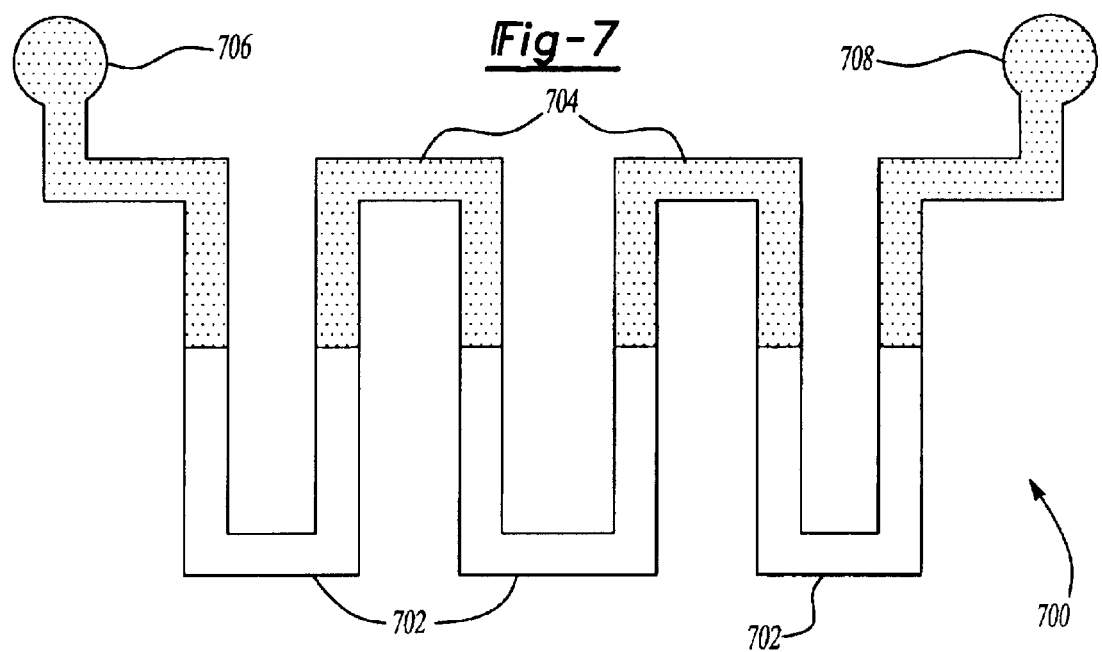
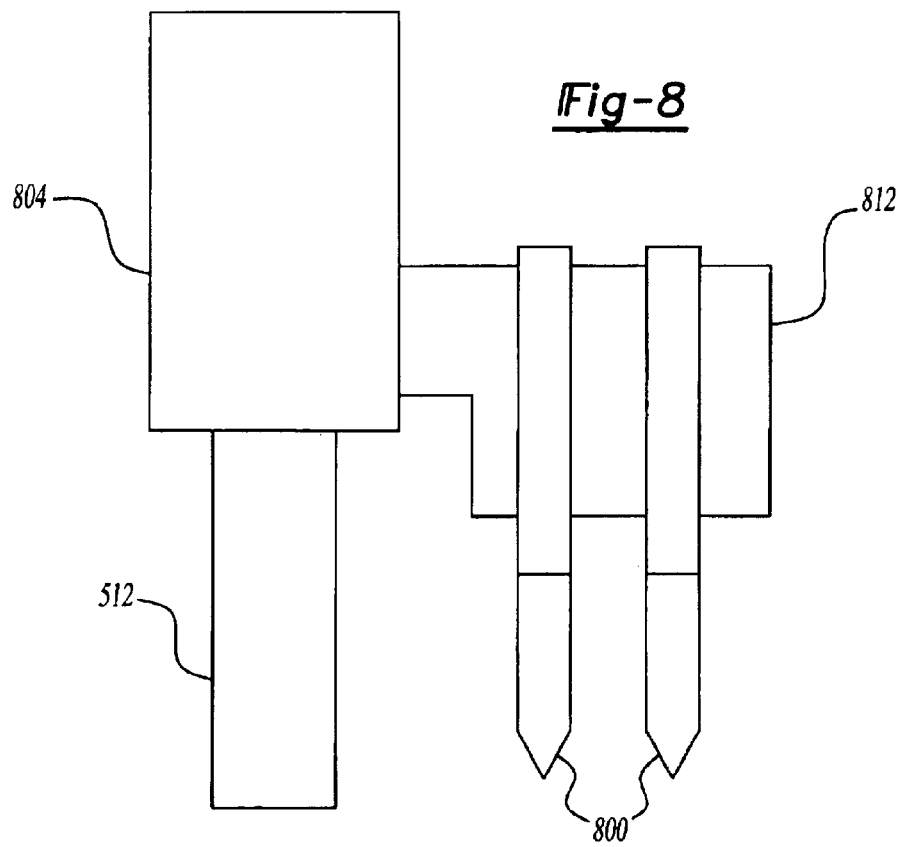

ANISOTROPIC BONDING SYSTEM AND METHOD USING DYNAMIC FEEDBACK

TECHNICAL FIELD

The invention relates to an anisotropic bonding system and process, and more particularly to an anisotropic bonding system and process that monitors an electrical characteristic of the bond in real-time to determine bond quality.

BACKGROUND ART

Anisotropic conductive films (ACF) and anisotropic conductive pastes (ACP) are becoming commonly used in the electronics industry to connect components together. These pastes or films 100 are composed of electrically conductive particles 100 dispersed in a non-conductive carrier material 104, such as a thermoset material, a thermo-setting material or a blend of the two, as illustrated in FIG. 1. Anisotropic bonding materials are commonly used to electrically connect the surfaces of conductors on two surfaces while at the same time isolating the connected conductors from adjacent conductors. This is due to the conductive properties of the anisotropic bonding material; when applied, the material conducts in the Z-axis direction only and not in the X- or Y-axes.

To join two conductive surfaces together, the anisotropic paste or strip material is placed between the two surfaces to be joined, and heat and pressure is applied to the assembly to bring the conductive surfaces into contact with the conductive particles in the film or paste, thereby forming an electrical path between the two conductive surfaces. The anisotropic material is available with various conductive particle sizes and distribution densities within the carrier material so that the appropriate anisotropic material can be selected for a given application. Generally, materials having smaller conductive particles are selected for conductors having finer pitches to avoid short circuits in the X or Y directions.

To improve the connection between the conductive surfaces being joined, there has been a trend toward using anisotropic materials with compressible conductive particles, with conductive metal-coated plastic particles being the most common. These particles are able to conduct electricity through the outer metal plating and are also compressible and have memory retention. The compressible conductive particles, however, require careful control over the compression process to avoid over- or under-compression, as illustrated in FIGS. 2 and 3.

More particularly, if the assembly is not compressed enough, as shown in FIG. 2, there will be an insufficient number of particles 102 that contact each other and the conductive surfaces to form a continuous current path, creating an interconnect exhibiting a high resistance. Further, if the particles 102 are not sufficiently compressed, the thermal cycling range of the assembly will be greatly reduced for reliable operation.

If the assembly is compressed past the elastic limit of the particles 102 as shown in FIG. 3, however, the metal coating on the particles 102 will form cracks 106 that interrupt the electrical path and increase the resistance in the interconnect as well. Further, cracks 106 in the particles 102 reduce the thermal cycling range of the assembly because thermal cycling may increase crack propagation and because the particles 102 are deformed beyond their elastic limits.

Current bonding methods adjust heat, time, and pressure of the assembly system to attempt to establish an acceptable bond. These methods tend to slightly over-cure the material and apply slightly too much pressure to ensure reliable bonding and to compensate for variations in the anisotropic material and temperature drift. The curing schedules of anisotropic bonds depend on time and temperature and have a relationship generally as follows:

$$T \approx 30/2^{\hat{0}((Te-180)/10)}$$

$$Te \approx (-10*(ln(T)-ln(15)-19* ln(2)))/ln(2)$$

where T=Time in seconds.
Te=Temperature in degrees Centigrade at the bond line and where in is a natural logarithm.

In this relationship, however, a 10-degree difference in bond line temperature can affect the bonding cure time significantly, by a factor of ≅−50%, +100%, depending on the direction of the temperature variation.

Further, known bonding processes apply temperature and pressure to the bond according to predetermined parameters without referring to the bond's actual characteristics during the compression process. FIG. 4 is a graph illustrating a bonding cycle that allows over-compression of the bond; as can be seen in the FIGURE, the pressure 400 is kept constant throughout the temperature cure schedule of this example. As can be seen in the graph, the high initial bond resistance 400 (due to the insulating characteristics of the carrier material) quickly decreases between 0 and 20 seconds as electrical connections start to form. At 11 seconds, the conductive particles start to form a path between the surfaces being connected 402 drops significantly between 20 and 24 seconds. The resistance falls further between 11 and 19 seconds, at which the traces are completely connected by conductive particles in the anisotropic material. The bond resistance stabilizes at around 24–30 seconds, but, as can be seen in the graph, pressure 400 continues to be applied to the bond at a constant rate.

At 36–40 seconds, the bond resistance 402 begins rising undesirably due to cracking of the electrically conductive coating on some of the compressed particles. After 40 seconds, the bond resistance stabilizes at the increased level because further compression is not possible at the selected temperature/pressure settings. Because known bonding processes keep the pressure level constant throughout the curing process, there is no way to prevent over-compression if cracking begins to occur before the temperature cure cycle is complete.

There is a need for a bonding process that reliably produces conductive bonds using anisotropic material without experiencing any increase in bond resistance or damage to conductive particles in the material.

SUMMARY OF THE INVENTION

Accordingly, the present invention is an anisotropic bonding system and method that prevents over-compression of the bond by monitoring an electrical characteristic, such as resistance, of the bond in real time during the compression and curing process. If the bond resistance reaches a predetermined level before the temperature cure cycle is over, the system reduces the pressure applied to the bond to a holding/clamping value as the curing process for the carrier portion of the anisotropic material completes. Because the bond characteristics are monitored during the bonding process, the conductive particles stay within their elastic limits, thereby minimizing or preventing cracking in the conductive coating, to ensure that the bond resistance remains low.

BRIEF DESCRIPTION OF THE DRAWINGS

FIG. 7 is a diagram illustrating one structure for measuring bond resistance in the present invention; and FIG. 8 is a diagram illustrating a possible contact structure to be used in the present invention.

DETAILED DESCRIPTION OF PREFERRED EMBODIMENTS

Figure 1:
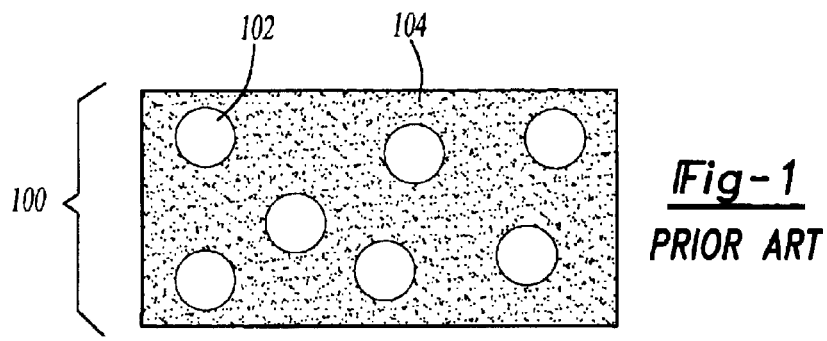
FIG. 1 is a representative diagram of an uncompressed anisotropic material.
Figure 2:
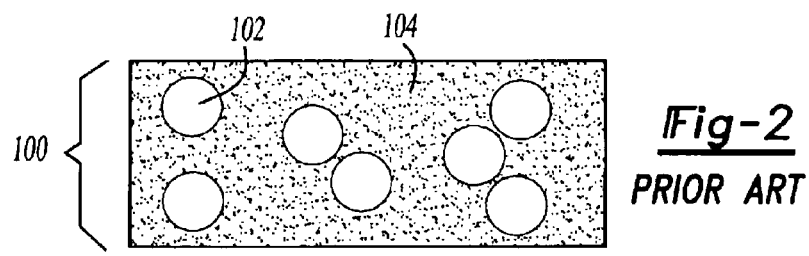
FIG. 2 is a representative diagram of the material shown in FIG. 1 after a limited amount of compression.
Figure 3:
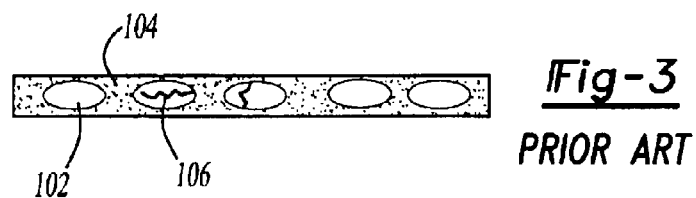
FIG. 3 is a representative diagram of the material shown in FIG. 1 after over-compression.
Figure 5:
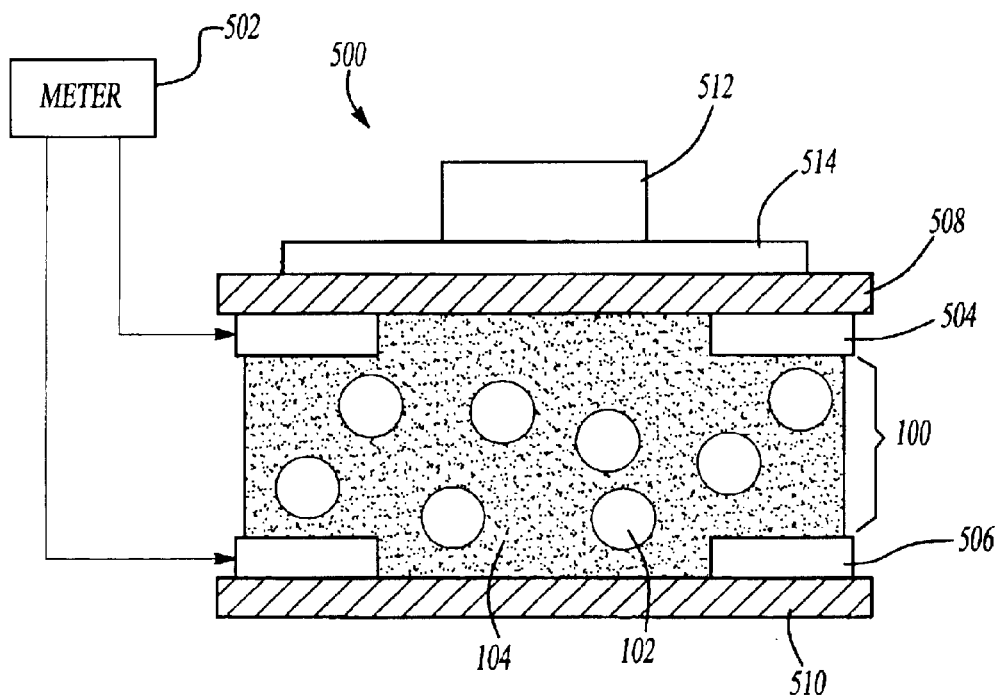
FIG. 5 is a representative diagram of a compression system according to the present invention.

FIG. 5 is a representative diagram illustrating an embodiment of the inventive system 500. As can be seen in the Figure, the system includes a means for measuring the bond resistance 502 coupled to conductive traces 504, 506 disposed on a top 508 and bottom 510 substrates, respectively. The system also includes a thermode 512 for monitoring the bond temperature and a compression member 514 that applies the pressure required to cure the insulating carrier material 104 in the bond.

During the bonding process, the new system provides dynamic feedback to the bonding equipment with respect to an electrical characteristic, such as the resistance, of the bond being made via the measuring means 502. The optimal resistance reading will vary depending on the specific anisotropic material being used in the bond. In practice, the bond is optimized using conventional time/pressure/temperature parameters for curing the carrier material. Once these parameters are initialized, the system obtains a resistance measurement between opposing traces 504, 506 to be electrically joined by the bonding system 500.

The resistance of the interconnect path between the conductive traces 504, 506, assuming interconnection of conductive particles 102 having the same resistance, is described as follows:

$$R_{AB} \cong R_U / N$$

where $R_{AB}$ is the total resistance between the two traces throughout the bond line, $R_u$ is the unit resistance across one conductivity particle, and N is the number of particles contacting the traces 504, 506.

Figure 4:
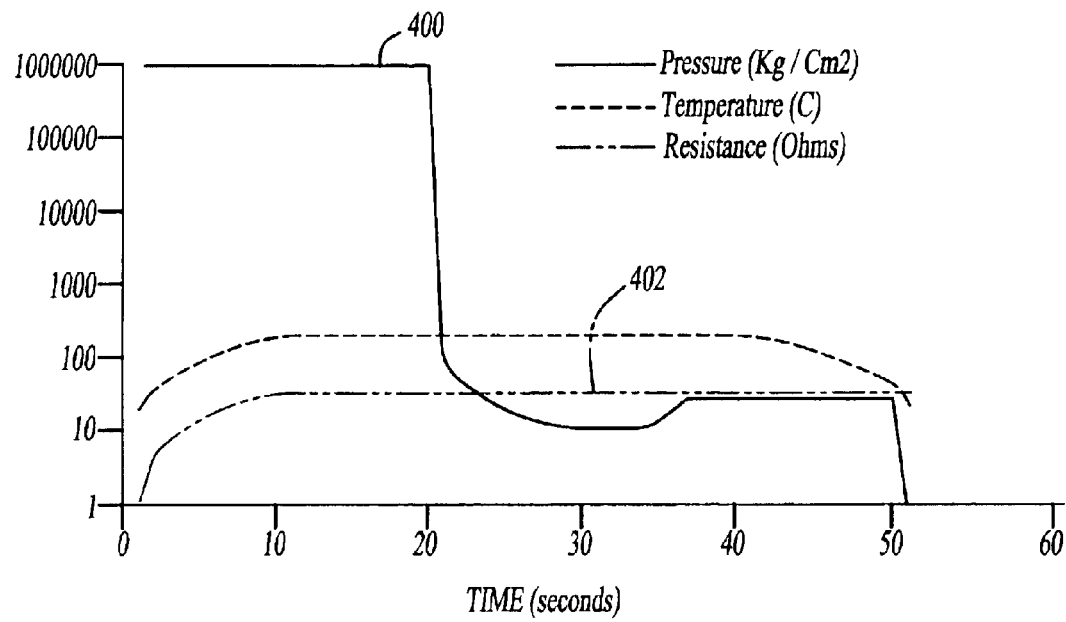
FIG. 4 is a graph illustrating a relationship between pressure, temperature, and bond resistance in a prior art compression process.
Figure 6:
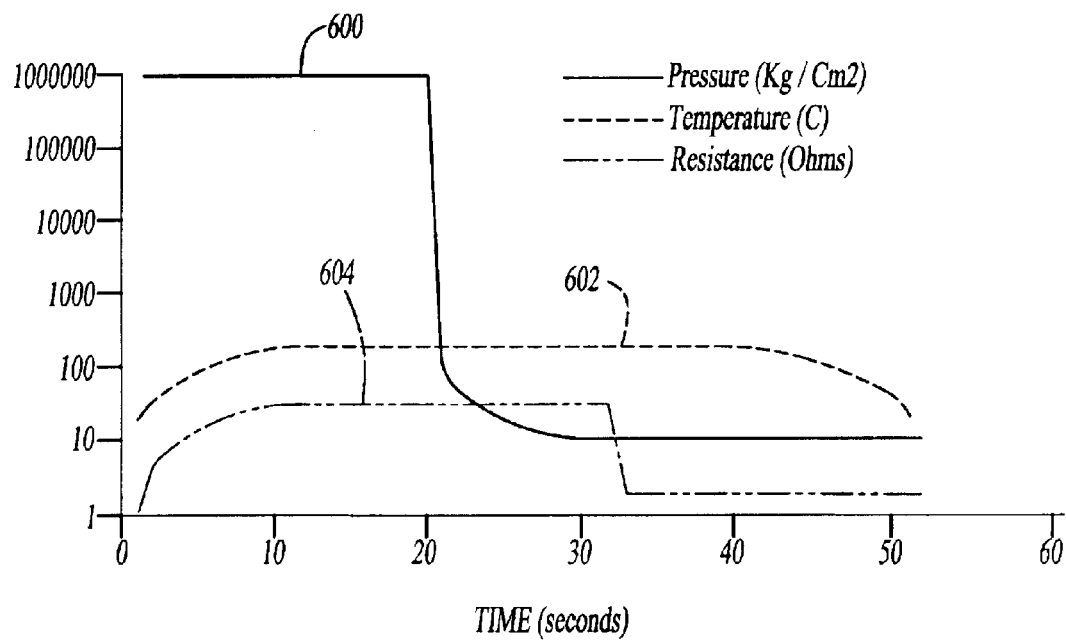
FIG. 6 is a graph illustrating a relationship between pressure, temperature, and bond resistance in a compression process according to the present invention.

FIG. 6 is a graph that illustrates the bond resistance of bond formed by an interconnection process according to the present invention. For clarity, the graph shown in FIG. 6 assumes that the curing process occurs using the same time and temperature parameters as the process shown in FIG. 4. From 0–20 seconds, the pressure 600 and temperature 602 applied to the bond is similar to the pressure and temperature application in the known process shown in FIG. 4. Between 20 and 24 seconds, the bond resistance 604 drops dramatically as the conductive particles begin contacting each other to connect the conductive surfaces. At around 30 seconds, the bond resistance stabilizes, indicating that the resistance has reached its lowest level and that the bond is at its maximum bond reliability.

More particularly, the lowest portion of the resistance curve 604 corresponds to a resistance value that is determined to indicate acceptable conductor compression within the elastic limits of the conductive particles 102 in the anisotropic material 100, with minimal cracking of the conductive coating on the particles 102. Once a bond resistance reaches a predetermined optimum resistance value, the pressure 600 is quickly reduced to a holding/clamping value as the remainder of the curing schedule is carried out at the selected temperature without any additional pressure being applied to the bond. For example, as can be seen in FIG. 6, the system significantly reduces the pressure 600 applied to the bond at around 32 seconds to prevent the bond from being compressed further once the minimum resistance value is reached, thereby maintaining the bond resistance 604 at the minimum value by keeping the conductive particles within their elastic limits, thereby minimizing electrical path degradation in the bond.

FIGS. 7 and 8 are examples of specific structures that can be used in the inventive system. More particularly, different components can be used in the inventive system to measure the bond resistance in real time and send feedback signals to the bonding equipment to control the pressure applied to the bond. For example, a data logger can be equipped with digital output signals to provide a program change condition directly to the bonding equipment. A preferred structure for measuring the bond resistance in real time is to use one or more "daisy chain" connections in the design of the final product, an example of which is shown in FIG. 7. As can be seen in the Figure, the daisy chain 700 connects multiple LCD or die connections 702 between multiple circuit board or flex connections 704 between two test points 706 and 708.

Furthermore, test probes 800, such as those in the structure shown in FIG. 8, may also be used to contact areas on the substrate during the bonding operation. These test probles 800 can be mounted as part of an "outrigger" test head 802 mechanically coupled to a thermode holder 804. Of course, the specific physical configuration of the components used to measure the bond characteristic, such as the bond resistance, is not limited to the structures shown in FIGS. 7 and 8 and can incorporate any components or circuits that can measure the bond characteristic in real-time during the bonding operation.

This real-time monitoring of bond resistance during the compression and curing process and controlling of the bonding process based on feedback signals corresponding to the bond resistance achieves faster bond/cure cycles because the process control of the final bond is achieved by parametric control of the bonding equipment settings. This system uses in-process parametric control of bonding equipment settings by means of resistive feedback of the interconnection resistance value in real-time to adjust machine parameters in process. It also eliminates very fine control of the pressure requirement since bond compression is now restricted to the resistance setting for the electrical path, thus allowing higher bonding pressures without over-compression reliability issues, and by this method also eliminates under-compression reliability issues. Of course, the method can monitor any other electrical characteristic in the bond without departing from the scope of the invention. This method and system yields extremely consistent results with increased reliability, and also allows much shorter bond cycles to be achieved with the same high quality results.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A method for connecting a first and a second conductive surface, comprising the steps of:
    placing an anisotropic material between the first and second conductive surfaces to form an assembly;
    curing the anisotropic material;
    compressing the assembly to form a bond between the first and second conductive surfaces via the anisotropic material;
    monitoring an electrical characteristic of the bond during at least one of the compressing and curing steps and generating a feedback signal corresponding to the electrical characteristic; and
    adjusting an amount of pressure applied during the compressing step in response to said feedback signal.

2. The method of claim 1, wherein the adjusting step includes the step of reducing the pressure applied during the compressing step to a holding/clamping level when the feedback signal indicates that the electrical characteristic has reached a predetermined threshold.

3. The method of claim 2, wherein the electrical characteristic monitored in the monitoring step is resistance.

4. The method of claim 1, wherein the electrical characteristic monitored in the monitoring step is resistance.

5. The method of claim 1, wherein the curing step includes heating the anisotropic material.

6. The method of claim 5, wherein the temperature is kept constant during the curing step.

7. The method of claim 5, wherein the heating and compressing steps are conducted simultaneously.

8. A method for connecting a first and a second conductive surface, comprising the steps of:
    placing an anisotropic material between the first and second conductive surfaces to form an assembly;
    heating the anisotropic material to cure the anisotropic material;
    compressing the assembly to form a conductive bond between the first and second conductive surfaces via the anisotropic material;
    monitoring a resistance of the conductive bond during at least one of the compressing and heating steps and generating a feedback signal corresponding to the resistance; and
    reducing the pressure applied during the compressing step to a holding/clamping level when the feedback signal indicates that the electrical characteristic has reached a predetermined threshold.

9. The method of claim 8, wherein the temperature is kept constant during the curing step.

10. The method of claim 8, wherein the heating and compressing steps are conducted simultaneously.

11. A system for connecting a first and second conductive surface, comprising:
    a compressor configured to apply pressure to an assembly having a first conductive surface and a second conductive surface with an anisotropic material disposed between the first and second conductive surfaces, said pressure causing a bond between the first and second conductive surfaces to be formed via the anisotropic material;
    means for curing the anisotropic material;
    a meter for measuring an electrical characteristic of the bond and generating a feedback signal corresponding to the electrical characteristic; and
    wherein said compressor is responsive to said feedback signal.

12. The system of claim 11, wherein the curing means is a heater, and wherein the system further comprises a thermode that monitors the temperature of the bond.

13. The system of claim 11, wherein the electrical characteristic measured by the meter is resistance.

14. The system of claim 11, wherein the compressor reduces the pressure to a holding/clamping level when the feedback signal indicates that the electrical characteristic of the bond has reached a predetermined threshold.

15. The system of claim 14, wherein the electrical characteristic measured by the meter is resistance.

* * * * *